(12) United States Patent
Ha et al.

(10) Patent No.: US 8,900,365 B2
(45) Date of Patent: Dec. 2, 2014

(54) APPARATUS FOR DEPOSITING MATERIAL ON ELONGATE SUBSTRATE

(75) Inventors: Hong Soo Ha, Changwon (KR); Sang Soo Oh, Changwon-si (KR); Dong Woo Ha, Changwon (KR); Kyu Jung Song, Seoul (KR); Rock Kil Ko, Gimhae (KR); Ho Sup Kim, Gimhae-si (KR)

(73) Assignee: Korea Electrotechnology Research Institute (KR)

( * ) Notice: Subject to any disclaimer, the term of this patent is extended or adjusted under 35 U.S.C. 154(b) by 1489 days.

(21) Appl. No.: 11/834,607

(22) Filed: Aug. 6, 2007

(65) Prior Publication Data
US 2008/0067273 A1    Mar. 20, 2008

(30) Foreign Application Priority Data

Sep. 15, 2006 (KR) .................. 10-2006-0089525

(51) Int. Cl.

| | |
|---|---|
| C23C 14/56 | (2006.01) |
| C23C 16/54 | (2006.01) |
| C23C 14/08 | (2006.01) |
| B65H 51/22 | (2006.01) |
| G11B 23/00 | (2006.01) |

(52) U.S. Cl.
CPC .............. *G11B 23/00* (2013.01); *C23C 14/562* (2013.01); *C23C 14/088* (2013.01); *B65H 51/22* (2013.01); *B65H 2601/2532* (2013.01); *B65H 2701/37* (2013.01)
USPC ......................................... 118/718

(58) Field of Classification Search
USPC ..................... 118/718; 204/298.24
See application file for complete search history.

(56) References Cited

U.S. PATENT DOCUMENTS

| | | | | | |
|---|---|---|---|---|---|
| 2,532,562 | A | * | 12/1950 | Lorig ............................ | 219/469 |
| 2,896,572 | A | * | 7/1959 | Burke ........................... | 118/420 |
| 3,272,175 | A | * | 9/1966 | Lorenz et al. ................ | 118/718 |
| 3,884,787 | A | * | 5/1975 | Kuehnle .................. | 204/192.12 |
| 5,499,774 | A | * | 3/1996 | Novak et al. ............... | 242/364.2 |
| 5,972,160 | A | * | 10/1999 | Straemke ................. | 156/345.43 |

(Continued)

FOREIGN PATENT DOCUMENTS

| | | |
|---|---|---|
| KR | 1020030076341 A | 9/2003 |
| KR | 1020050073943 A | 7/2005 |

*Primary Examiner* — Karla Moore
(74) *Attorney, Agent, or Firm* — Park & Associates IP Law, P.C.

(57) ABSTRACT

Disclosed is a deposition apparatus for depositing a specific substance on an elongate substrate such as an elongate strip of tape or film. The apparatus includes a vacuum chamber, supply reel and the for reel for supplying elongate substrate in rolled form, a drum, disposed in the vacuum chamber, the drum having a helically-shaped guide groove formed along an outer surface of the drum for receiving the elongate substrate supplied from the supply reel to be wound in the guide groove and to subsequently feed the elongate substrate to a retreat reel to wind thereon upon rotation of the drum, and a deposition source material for depositing a material onto a surface of the elongate substrate which is wound on the drum. The apparatus further includes at least one slip-roller disposed adjacent to the drum in a longitudinal direction of the drum, wherein the slip-roller at least partially protrudes outwardly from an outer surface of the drum and being rotated in a moving direction of the elongate substrate such that a portion of the elongated substrate received in the helically-shaped guide groove of the drum is pulled out of contact from the guide groove to reduce a frictional contact there-between as the elongated substrate is fed upon rotation of the drum and the slip-roller.

6 Claims, 2 Drawing Sheets

(56) References Cited

U.S. PATENT DOCUMENTS

| | | | |
|---|---|---|---|
| 8,353,257 B2 * | 1/2013 | Ha et al. | 118/234 |
| 8,460,746 B2 * | 6/2013 | Dadd et al. | 427/117 |
| 2004/0040506 A1 * | 3/2004 | Ovshinsky et al. | 118/718 |
| 2006/0182891 A1 * | 8/2006 | Usoskin et al. | 427/402 |

* cited by examiner

APPARATUS FOR DEPOSITING MATERIAL ON ELONGATE SUBSTRATE

FIELD OF THE INVENTION

The present invention relates to a deposition apparatus for depositing a specific substance on a long strip of tape or film, and more particularly, to a deposition apparatus for elongate tape, which is capable of minimizing damage of tape during deposition and enabling the tape to be smoothly supplied as the friction between the tape and the circumferential outer surface of a drum is reduced during deposition by using a slip-roller installed to extend along the longitudinal direction of the drum and protrude from the circumferential outer surface of the drum.

BACKGROUND OF THE INVENTION

Generally, deposition on a long strip of tape is performed through a reel-to-reel method. In this method, two reels are used: one reel is a supply reel for supplying a strip of tape and the other reel is a retreat reel for winding a strip of tape on which specific substance is deposited therearound. Further, according to the reel-to-reel method, since deposition of specific substance and supply and retreat of tape can be continuously performed in a single vacuum chamber, it is possible to produce a long strip of tape having the surface on which specific substance is deposited.

Although the above-described method has an advantage in that it is possible to produce a long strip of tape because deposition area depends on distance between the supply reel and the retreat reel, it also has a disadvantage in that it takes a long period to deposit the specific substance on tape.

There is an improved deposition method (batch-type method) which is capable of shortening deposition period. According to this method, a vacuum chamber has a drum therein, which has a guide groove helically formed on the outer surface thereof, and a long strip of tape is wound along the guide groove. Further, a deposition source is disposed at a side of the drum and the drum is rotated so that specific substance from the deposition source is deposited on the entire surface of the tape by a single time of deposition process. Accordingly, the deposition on a long strip of tape is conducted in a batching method.

However, the batch-type method has a disadvantage in that a length of tape which can be wound along the guide groove is limited according to size of the drum. That is, in order to obtain a long strip of tape having the surface on which specific substance is deposited, a large size of drum is needed. In this case, since the drum occupies a large space in a laboratory, manufacturing cost of the deposition apparatus is increased due to the increased size of a vacuum chamber and a pump, and cost and time for operating the large-sized drum is also increased.

Accordingly, in order to solve the above-described problems of the batch-type method, developed is a combined deposition method combining the reel-to-reel method and the batch-type method. That is, a supply reel which supplies a strip of tape to be deposited and a retreat reel for winding a strip of deposited tape are installed at both sides of a shaft of a drum. A tape unwound from the supply reel is moved toward the drum, moved along the guide groove on the surface of the drum and then wound around the retreat reel right after the surface of the tape is deposited with predetermined substance. In this case, since the tape having sufficient length is wound around the supply reel, limitation of the tape length according to the size of drum is obviated. Further, according to this method, it is possible to deposit a substance on a large surface area, and the advantage of the batch-type method also can be enjoyed.

However, this method also has a disadvantage in that edges of tape are likely damaged because there is tension of tape due to frictional force between the tape and the drum because the long strip of tape is in contact with the guide groove of the drum when the tape is moved. Under circumstances, it also can happen that the tape is never moved when the total frictional force is too high.

This problem can be a cause of degradation of superconductive property of a high temperature superconductive film deposited on tape at high temperature in the case where the specific substance formed on the tape is a high temperature superconductive film. The high temperature superconductive film is generally made of ceramic. Accordingly, if tension is exerted to the tape, the superconductive film made of ceramic and formed on the tape can have fine cracks. This causes decrease of threshold current, resulting in degradation of superconductive property.

SUMMARY OF THE INVENTION

Therefore, the present invention has been made in view of the above problems, and it is an object of the present invention to provide a deposition apparatus for elongate tape, which is capable of reducing damage of tape and enabling the tape to be smoothly supplied during deposition as the tension of the tape is minimized and the friction between the tape and the outer surface of a drum is reduced during movement of the tape, with the aid of a slip-roller which is installed to protrude from the outer surface of the drum and to extend in a longitudinal direction of the drum.

In order to achieve the object of the present invention, there is provided a long-tape deposition apparatus, comprising: a drum having a helically-shaped guide groove formed along an outer surface thereof and a long strip of tape wound along the guide groove, the drum being disposed in a vacuum chamber; a deposition source disposed at a side of the drum to be distanced from the drum; a supply reel and a retreat reel disposed at respective sides of a shaft of the drum for supplying a strip of tape and winding the strip of tape, respectively, in which specific substance is deposited on a surface of the tape while the tape is moved by the supply reel and the retreat reel and the drum is rotated; and a slip-roller having a longitudinal shape installed to extend in a longitudinal direction of the drum and disposed to be near the drum so as to protrude from an outer surface of the drum, the slip-roller being rotated in a moving direction of the tape, wherein the tape slips over the guide groove when the tape is moved.

The number of the slip-roller may be plural, and the plurality of the slip-rollers are arranged along circumference of the drum and linked by a rotation chain so that they can be rotated at the same time.

The slip-roller/the slip-rollers may be coupled to a support/supports provided in the drum using a bearing/bearings.

Thus, since the slip-rollers extending in a longitudinal direction of the drum and installed to protrude from the outer circumferential surface of the drum rotate in the same direction as the direction along which the tape moves in order to complement movement of the tape, the tape can slip over the surface of the drum, resulting in decrease of friction between the tape and the surface of the drum. Thus, when the tape moves, there is almost no tension of the tape, so that the tape is continuously and smoothly supplied to the drum without damage thereof. That is, the long strip of tape deposited with specific substance can be continuously produced. Further, specific substance with a uniform composition ratio can be deposited on undamaged tape.

BRIEF DESCRIPTION OF THE DRAWINGS

The above and other objects, features and other advantageous effects of the present invention will be more clearly understood from the following detailed description taken in conjunction with the accompanying drawings, in which.

DETAILED DESCRIPTION OF THE INVENTION

Figure 1:
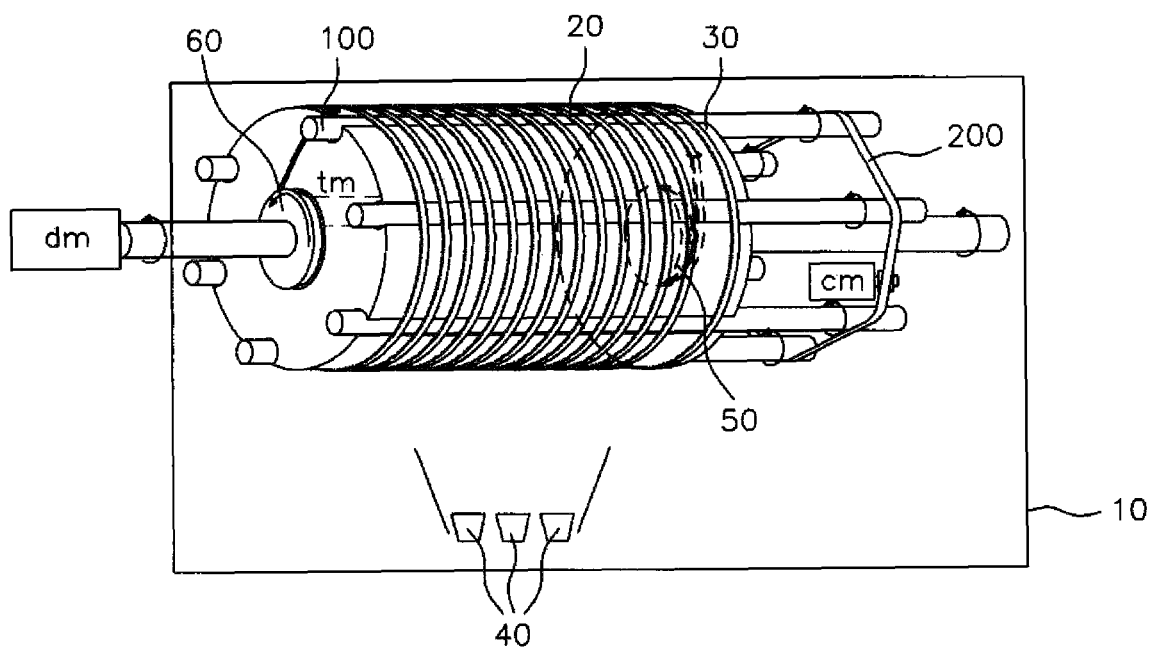
FIG. 1 is a perspective view illustrating a main part of a long-tape deposition apparatus according to one embodiment of the present invention.
Figure 2:
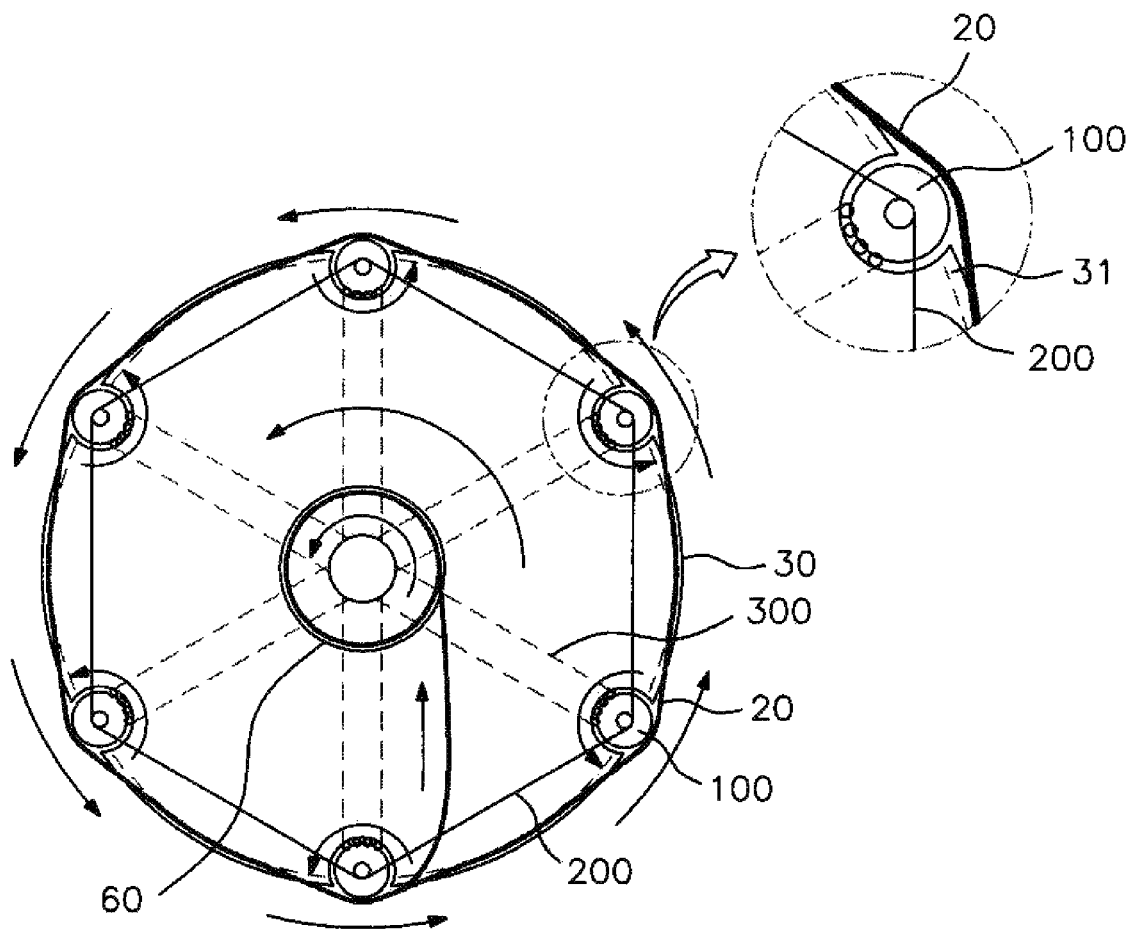
FIG. 2 is a schematic view illustrating a side of the long-tape deposition apparatus according to one embodiment of the present invention

Hereinafter, a long-tape deposition apparatus according to a preferred embodiment of the present invention will be described with reference to accompanying drawings. FIG. 1 is a perspective view illustrating a main part of a long-tape deposition apparatus according to one embodiment of the present invention and FIG. 2 is a schematic view illustrating a side of a long-tape deposition apparatus according to one embodiment of the present invention.

As shown in drawings, a strip of tape 20 having the surface to be deposited with predetermined substance is wound along a helical-shaped guide groove formed on the outer surface of a drum 30. The tape 20 is supplied from a supply reel 50 disposed at a side of the drum 30 in continuing manner and is wound around a retreat reel 60 disposed at the opposite side of the drum 30 after predetermined substance is deposited on the surface of the tape 20.

The predetermined substance includes all substances which can be deposited in a vacuum chamber 10, and preferably be a high temperature superconductive material, a semiconductor material, or a metal.

All of the above-described elements are disposed in the vacuum chamber 10 in which the vacuum state is kept, and at least one deposition source 40 for an evaporation deposition apparatus, a sputtering deposition apparatus, a physical deposition apparatus or a chemical deposition apparatus is disposed at a side of the drum 30 while being distanced from the drum 30 in a longitudinal direction of the drum 30.

A first composition is emitted from the deposition source 40 in vapor or plasma state, and is deposited as a second composition on the upper surface of the tape 20 wound around the drum 30, which faces the deposition source 40. At this time, the drum 30 is connected to a driving motor so that it is continuously rotated, and the tape 20 wound around the drum 30 along the guide groove 31 is moved at a predetermined constant speed as the retreat reel 60 rotates. As a result, the tape 20 is continuously supplied from the supply reel 50, and a large area on the tape can be deposited with predetermined substance in a short time.

The supply reel 50 and the retreat reel 60 are driven by a driving motor dm so that the tape 20 is moved toward the drum 30 with a predetermined tension. The supply reel 50 and the retreat reel 60 are disposed in the drum 30 or disposed in a manner such that they are sealed from the deposition source 40 or a heater, such that unnecessary substance is added to the specific substance deposited on the tape 20.

When the tape 20 moves, the tape 20 is in contact with the guide groove 31 of the drum 30. As the drum 30 has larger size, the tape 20 is longer, and the tape 20 is wider, frictional force caused by contact resistance becomes larger.

Further, due to the shape of the drum 30, heat from the heater can not uniformly reach the entire surface of the tape 20, so that expansion of the tape 20 is not uniform all over the areas. As a result, when the tension is adjusted by the driving motor dm for driving the supply reel 50 and the retreat reel 60, some portions of the tape 20 can receive excessive tension, resulting damage of the tape 20.

In order to reduce friction caused due to contact resistance and prevent excessive tension from being exerted onto the tape 20, a slip-roller 100 is provided. Thanks to the slip-roller 100, the tape 20 does not move along the guide groove 31 of the drum 30 in a state in which it is in contact with the surface of the guide groove 31 during movement of the tape 20 but slips over the guide groove 31 of the drum 30 at some locations of the drum 30.

The slip-roller 100 may have a cylindrical shape and extends along the longitudinal direction of the drum 30. The main part of the slip-roller 100 is installed to be near the outer circumferential surface of the drum 30 and to protrude from the outer surface of the drum 30. The slip-roller 100 is connected to a driving motor cm, so that it rotates in the same direction as moving direction of the tape 20, which is the same as the rotational direction of the drum 30.

Further, the deposition apparatus according to the present invention includes a plurality of slip-rollers 100 instead of one. The slip-rollers 100 are arranged at regular intervals along the circumferential direction of the drum 30. The slip-rollers 100 are linked by a rotation chain 200 connected to the driving motor cm so that they rotate at the same time. If needed, contact pressure between the tape 20 and the guide groove 31 can be adjusted.

The slip-roller 100 is installed in a manner such that most of the body thereof is received in a depression (i.e., groove) which is formed on the outer surface of the drum 30 and has a diameter slightly larger than that of the slip-roller 100, and a portion of the body is not received in the depression but protrudes outward from the drum 30. In the case in which the drum 30 is a cylinder shape without depressions, the entire body of the slip-rollers 100 is exposed externally from the circumferential outer surface of the drum 30. Plural slip-rollers are coupled with plural supports 300 installed in the drum 30 so that the slip-rollers 100 are suspended at a position where the slip-rollers 100 are not in contact with the surface of the depression (groove) or the outer circumference of the drum 30. The supports 300 are connected to the rotation shaft of the drum 30, and are coupled to the slip-rollers 100 with bearings (see FIG. 2) placed in between in order to minimize the friction between the parts.

That is, since the slip-rollers 1 00 are installed to slightly protrude from the circumferential surface of the drum 30, the slip-rollers 1 00 can suspend the tape 20 moving along the guide groove 31 of the drum 30 from the surface of the guide groove 31 at portions near the slip rollers 100, so that the tape 20 can be moved slipping because the tape 20 is not in contact with the surface of the guide groove 31, resulting in reduction of contact resistance.

Further, in the case in which the expansion of the tape 20 is not uniform over its locations due to heat which does not uniformly reach the tape, since highly expanded portion of the tape 20 slips just little in the moving direction of the tape 20, so that variation of tension which is caused by uneven heat expansion of the tape 20 is automatically compensated. Accordingly, tension of the tape 20 caused by the supply reel 50 and the retreat reel 60 is uniformly maintained.

According to the present invention, since the slip-rollers extending in a longitudinal direction of the drum and installed to protrude from the outer circumferential surface of the drum rotate in the same direction as the direction along which the tape moves in order to complement movement of the tape, the tape can slip over the surface of the drum, resulting in decrease of friction between the tape and the surface of the drum. Thus, when the tape moves, there is almost no tension of the tape, so that the tape is continuously and smoothly supplied to the drum without damage thereof. That is, the long strip of tape deposited with specific substance can be continuously produced.

Further, specific substance with a uniform composition ratio can be deposited on undamaged tape. Still further, in the case in which the specific substance is a high temperature superconductive film, the present invention can produce a long strip of tape with high temperature superconductive film with superconductive property which is not degraded.

What is claimed is:

1. An apparatus for depositing materials on an elongate substrate, comprising:
    a vacuum chamber;
    a supply reel for supplying an elongate substrate in rolled form;
    a drum rotatably disposed in the vacuum chamber, the drum having a helically-shaped guide groove formed along an outer surface of the drum for receiving the elongate substrate supplied from the supply reel to be wound in the guide groove and to subsequently feed the elongate substrate to a retreat reel to wind thereon upon rotation of the drum;
    a deposition source material received in the vacuum chamber for depositing a material onto a surface of the elongate substrate which is wound on the drum; and
    at least one slip-roller disposed adjacent to an outer circumference of the drum and in a longitudinal direction of the drum, the slip-roller at least partially protruding outwardly from an outer surface of the drum and with the elongate substrate surrounding outwardly around a combination of the drum and the slip-roller, the slip-roller being rotated by a driving motor in a moving direction of the elongate substrate such that a portion of the elongated substrate received in the helically-shaped guide groove of the drum is pulled out of contact from the guide groove by the outwardly protruded slip roller to reduce a frictional contact there-between as the elongated substrate is fed upon rotation of the drum and the slip-roller.

2. The apparatus according to claim 1, further comprising at least one support each coupled with the drum so as to rotate together with the drum, the support adapted to support the slip-roller to maintain a predetermined position relative to the drum.

3. The apparatus according to claim 2, further comprising at least one bearing disposed between the support and the slip-roller.

4. The apparatus according to claim 1, wherein the number of the slip-roller is plural, and the plurality of the slip-rollers are arranged along the outer circumference of the drum and linked by a rotation chain so that they can be rotated simultaneously at a same speed.

5. The apparatus according to claim 4, wherein a plurality of supports are rotatably coupled with the drum, each support adapted to support a corresponding slip-roller to maintain a predetermined position relative to the drum.

6. The apparatus according to claim 5, further comprising at least one bearing disposed between each support and its corresponding slip-roller.

* * * * *